United States Patent
Ugale et al.

(10) Patent No.: US 10,333,512 B2
(45) Date of Patent: Jun. 25, 2019

(54) INTELLIGENT INPUT FOR RELAY DEVICE CONTAINING A SOLID STATE RELAY

(71) Applicant: Infineon Technologies AG, Neubiberg (DE)

(72) Inventors: Ramdas Rangnath Ugale, Pune (IN); Jerome Py, Munich (DE)

(73) Assignee: Infineon Technologies AG, Neubiberg (DE)

(*) Notice: Subject to any disclaimer, the term of this patent is extended or adjusted under 35 U.S.C. 154(b) by 380 days.

(21) Appl. No.: 14/987,484

(22) Filed: Jan. 4, 2016

(65) Prior Publication Data
US 2017/0194956 A1    Jul. 6, 2017

(51) Int. Cl.
*H03K 17/28*   (2006.01)
*H01H 47/00*   (2006.01)
(Continued)

(52) U.S. Cl.
CPC ........... *H03K 17/28* (2013.01); *H01H 47/002* (2013.01); *H02H 3/202* (2013.01); *H02H 3/207* (2013.01); *H02H 9/04* (2013.01)

(58) Field of Classification Search
CPC . H01L 21/4882; H01L 21/50; H01L 21/8213; H01L 21/8252; H01L 2224/26175; H01L 2224/29007; H01L 2224/29036; H01L 2224/291; H01L 2224/32245; H01L 2224/37011; H01L 2224/37099; H01L 2224/40; H01L 2224/40245; H01L 2224/45144; H01L 2224/48465; H01L 2224/49111; H01L 2224/73221; H01L 2224/73271; H01L 2224/83192; H01L 2224/83815; H01L 2224/84; H01L 23/047; H01L 23/13; H01L 23/367; H01L 23/3677; H01L 23/3735;
(Continued)

(56) References Cited

U.S. PATENT DOCUMENTS 4,061,955 A   12/1977 Thomas et al.
4,345,289 A   8/1982 Howell
(Continued)

FOREIGN PATENT DOCUMENTS

GB   2428311 A   * 1/2007   ............. H02H 3/087

OTHER PUBLICATIONS

"Smart Highside High Current Power Switch," Infineon, PROFET Data Sheet BTS555, Jun. 1, 2010, 16 pp.

*Primary Examiner* — Thienvu V Tran
*Assistant Examiner* — Nicolas Bellido
(74) *Attorney, Agent, or Firm* — Shumaker & Sieffert, P.A.

(57) ABSTRACT

Relays can be used in a variety of applications that use a smaller signal to control a higher power load. Some example loads include motors, stadium lighting and the like. Mechanical relays consist of a coil controlling a magnet that moves electrical contacts. Solid state relays can offer advantages such as lower power consumption and higher reliability than mechanical relays. However, using a solid state relay in a system designed for a mechanical relay can require some significant changes to the system. This disclosure presents a device, a system and technique to operate a solid state relay (SSR) in applications that use mechanical relays while minimizing the need for potentially costly modifications.

20 Claims, 5 Drawing Sheets

(51) Int. Cl.
*H02H 9/04* (2006.01)
*H02H 3/20* (2006.01)

(58) Field of Classification Search
CPC ............ H01L 23/492; H01L 23/49537; H01L 23/49575; H01L 24/37; H01L 24/40; H01L 24/80; H01L 24/83; H01L 25/072; H01L 25/165; H01L 25/167; H01L 27/0255; H01L 27/0605; H01L 27/0722; H01L 27/0727; H01L 27/144; H01L 29/0619; H01L 29/0696; H01L 29/1608; H01L 29/2003; H01L 29/66068; H01L 29/872; H01L 2924/00; H01L 2924/00014; H01L 2924/0002; H01L 2924/014; H01L 2924/10272; H01L 2924/1033; H01L 2924/1203; H01L 2924/12032; H01L 2924/12036; H01L 2924/12041; H01L 2924/12043; H01L 2924/1301; H01L 2924/13033; H01L 2924/13055; H01L 2924/1306; H01L 2924/13091; H01L 2924/15747; H01L 2924/3025; H01L 31/1113; H01L 31/125; H01L 31/167; H01L 31/173; H01L 47/00; H01L 47/002; H01L 2224/859; H01L 2924/10253; H02H 3/02; H02H 3/023; H02H 3/05; H02H 3/06; H02H 3/08; H02H 3/087; H02H 3/202; H02H 3/207; H02H 7/1222; H02H 7/1225; H02H 7/18; H02H 9/004; H02H 9/041; H02H 3/006; H02H 3/093; H02H 3/20; H02H 3/24; H02H 3/243; H02H 3/28; H02H 3/325; H02H 3/353; H02H 3/36; H02H 7/222; H02H 9/04; H02H 9/046; H03K 17/04123; H03K 17/0414; H03K 17/08; H03K 17/08122; H03K 17/08126; H03K 17/08144; H03K 17/0822; H03K 17/0824; H03K 17/122; H03K 17/133; H03K 17/145; H03K 17/20; H03K 17/28; H03K 17/567; H03K 17/602; H03K 17/687; H03K 17/6871; H03K 17/6874; H03K 17/689; H03K 17/691; H03K 17/725; H03K 17/78; H03K 17/785; H03K 17/79; H03K 17/795; H03K 19/00384; H03K 2017/0806; H03K 2217/0009; H03K 3/012; H03K 3/017; H03K 5/003; H03K 17/30; H03K 17/51; H05K 1/0204; H05K 1/111; H05K 2201/042; H05K 2201/066; H05K 2201/09745; H05K 2201/10053; H05K 2201/10242; H05K 2201/10303; H05K 2201/1031; H05K 2201/10318; H05K 2201/10363; H05K 2201/2036; H05K 3/3431; H05K 7/1422; H05K 7/1468; H05K 7/1471; H05K 7/1484; H05K 7/20509

USPC .................... 361/78, 86, 22, 33, 56, 90, 187
See application file for complete search history.

(56) References Cited

U.S. PATENT DOCUMENTS

| | | | | |
|---|---|---|---|---|
| 4,856,047 | A * | 8/1989 | Saunders | H04M 11/04 340/7.55 |
| 5,459,732 | A * | 10/1995 | Wise | B60T 8/885 701/76 |
| 5,834,943 | A * | 11/1998 | Miller | G08B 29/14 324/549 |
| 7,660,083 | B2 * | 2/2010 | Yao | H01H 9/542 218/143 |
| 2002/0166073 | A1 * | 11/2002 | Nguyen | G06F 1/26 713/300 |
| 2007/0024124 | A1 * | 2/2007 | Zalmanoff | H03K 17/04123 307/116 |
| 2007/0109696 | A1 * | 5/2007 | Williamson | H02H 3/338 361/42 |
| 2010/0322751 | A1 * | 12/2010 | Bark | H02J 1/14 414/539 |

* cited by examiner

INTELLIGENT INPUT FOR RELAY DEVICE CONTAINING A SOLID STATE RELAY

TECHNICAL FIELD

This disclosure relates to solid state relays and techniques for controlling solid state relays.

BACKGROUND

Relays can be used in a variety of applications that use a smaller signal to control a higher power load. Example loads that may be controlled by a relay include motors, stadium lighting and a wide variety of other loads. Mechanical relays consist of a coil controlling a magnet that moves electrical contacts. Solid state relays can offer advantages such as lower power consumption and higher reliability than mechanical relays. However, using a solid state relay in a system designed for a mechanical relay can require some significant changes to the system.

SUMMARY

In general, the disclosure describes a device, a system and technique to operate a solid state relay (SSR) device. The disclosure describes a solid state relay device and techniques that can use the same or similar types of input as a mechanical relay. This allows applications that use mechanical relays to take advantage of an SSR while minimizing the need for potentially costly modifications. The device, system and techniques also offer the advantage of detecting certain faults and instability in the signals used to control the SSR. In one example, the disclosure is directed to a SSR that includes an output port and an input port. The relay device comprises a solid state relay (SSR) wherein an output of the SSR corresponds to the output port of the relay device. The SSR may also include a control unit configured to receive an input signal at the input port of the SSR and determine a voltage level of the input signal received at the input port. In response to the voltage level of the input signal satisfying a threshold, wait for a pre-determined time delay, and after the pre-determined time delay, control the output of the SSR.

In another example, the disclosure is directed to a method. The method may comprise receiving an input signal at an input port of a SSR, then determining whether a voltage level of the input signal received at the input port of the SSR satisfies a threshold. In response to the voltage level of the input signal satisfying the threshold, controlling an output of the SSR after a predetermined delay.

In another example, the disclosure is directed to a system comprising a power supply, a SSR that includes an output port and an input port, an input switch configured to supply the input signal to the input port of the SSR and a load controlled by the output port of the SSR. The SSR may also include a control unit configured to receive an input signal at the input port of the SSR and determine a voltage level of the input signal received at the input port. In response to the voltage level of the input signal satisfying a threshold, wait for a pre-determined time delay, and after the pre-determined time delay, control the output of the SSR. The system may contain an input switch configured to supply the input signal to the input port of the SSR and a load controlled by the output port of the SSR The details of one or more examples are set forth in the accompanying drawings and the description below. Other features, objects, and advantages of the techniques described in this disclosure will be apparent from the description and drawings, and from the claims.

DETAILED DESCRIPTION

Figure 1:
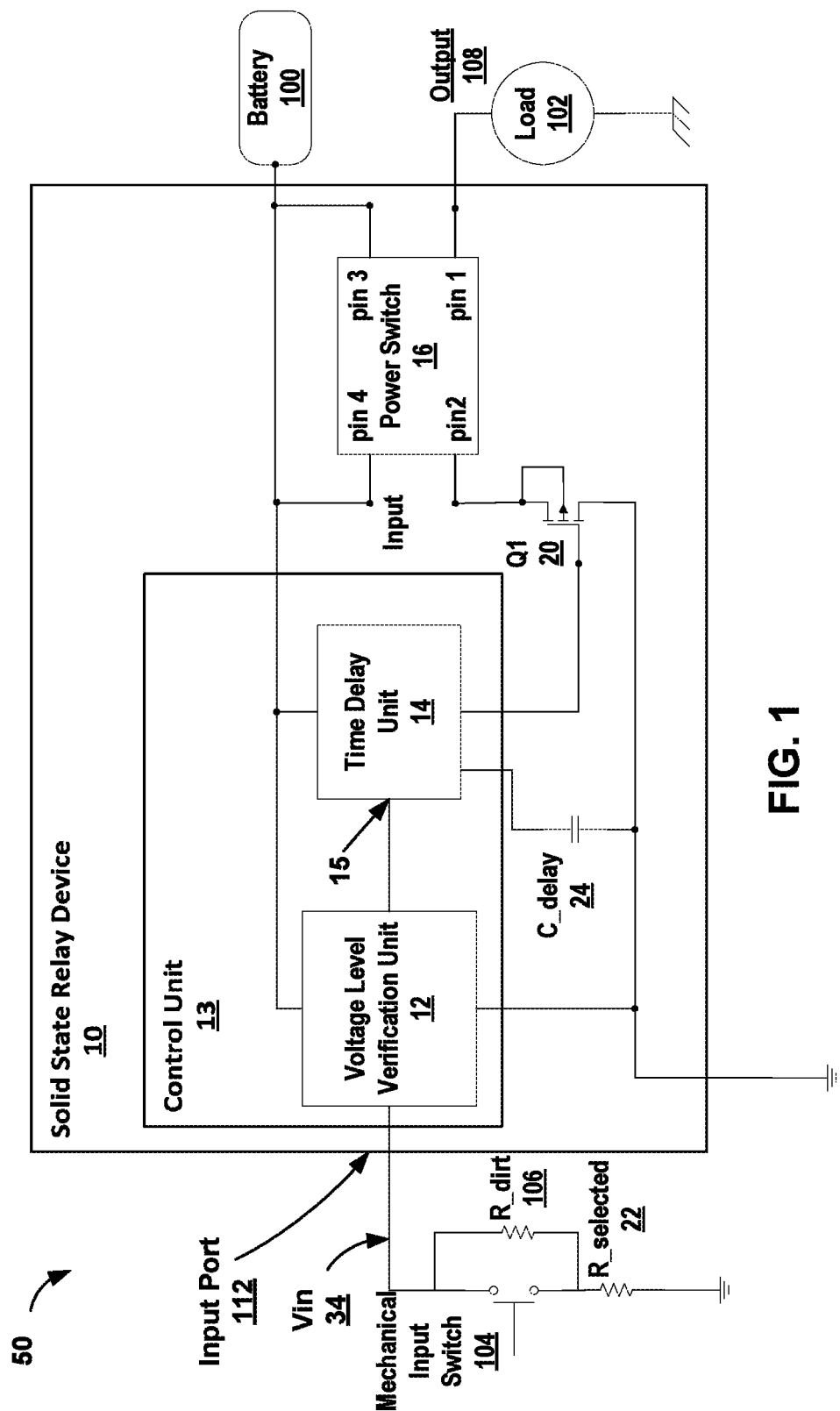
FIG. 1 is a conceptual and schematic block diagram illustrating a solid state relay (SSR) controlled by circuitry that verifies the input signal meets voltage and timing thresholds.

The disclosure presents a device, a system and technique to operate a solid state relay (SSR). The disclosure presents a solid state relay device and techniques that may use the same or similar types of input switch as that used for a mechanical relay, such as a mechanical switch, a hall switch, a signal from a controller and similar input mechanisms. This may allow an application that uses mechanical relays to take advantage of an SSR while minimizing the need for potentially costly modifications. Solid state relays may offer some advantages over mechanical relays such as greater reliability, faster switching speed, less system noise and lower power consumption. Greater reliability for solid state relays may manifest as a greater mean time between failures (MTBF) and fewer replacements when compared to a mechanical relay. Lower power consumption can come from the lower current required to activate a solid state relay compared to the amount of current required to energize a coil in a mechanical relay.

The device, system and techniques may also offer the advantage of detecting certain faults and instability in the input signals used to control the SSR. In one example, a relay can be used to energize a starter motor for an internal combustion engine, such as that used on a motorcycle. The relay may be activated by a key switch or other type of switch. Once the input switch activates the relay, the relay may deliver power to the starter motor to start the internal combustion engine. The wiring between the key switch and the starter motor may have certain faults. For example, the wiring may get a short to ground (STG) or a short to the battery (STB). This may drain the battery, raise a safety concern by inadvertently energizing a motor, or cause other problems, such as stress on the wire harness and other components. Therefore detecting either a STG or STB type of fault can provide advantages in many applications, such as greater reliability. Merely switching a mechanical relay for an SSR may require over-dimensioning the SSR, which may result in a higher cost for the SSR to manage power dissipation and function properly and reliably, especially if there is a risk of STG or STB.

The phrase "short to battery" (STB) is used throughout this disclosure. Although STB implies the existence of a battery, this phrase may refer to a short to any type of power supply and does not necessarily imply the existence of a battery. This may include power supply that provides a negative voltage, i.e. −V, instead of +V. Therefore discussions of STB are equally applicable to systems that have no battery, but may have a short to the power supply. Such systems may include power supplied by a battery, a generator, an alternator, an external power supply, combinations of such power supplies, and/or other power sources.

Another type of fault may result from corrosion or contaminants in a mechanical input switch used to control the relay. Corrosion or contamination may be caused by dirt, water, humidity, hydrocarbons and or other factors. The corrosion or contamination can cause leakage in the input signal across the switch while the switch is in the OFF or open position. If the resistance across the switch gets low enough, the leakage may inadvertently activate the relay, or drain the power supply such as a battery, though the switch is OFF. This resistance across the switch may be called "dirt resistance or "R_dirt." Detecting this type of fault and preventing inadvertent relay activation may have some advantages in a variety of applications.

The input signal to a relay may also be subject to instability. When the contacts of any mechanical switch come together upon closing, they may rebound before settling, usually within milliseconds, causing bounce. "Bouncing" is the tendency of any two metal contacts in an electronic device to generate multiple signals as the contacts close or open. Activating any mechanical switch may result in bounce, causing the output to appear as multiple switch activations. If this signal is used as an input to a digital counter, for example, the counter may show multiple counts rather than the expected single count. A "debounce" unit is any kind of hardware device, or software, that ensures that only a single signal will be acted upon for a single opening or closing of a contact. In the motorcycle example above, a relay device that activates the starter motor by applying power in a single, clean transition may have advantages over one that sends several pulses of power each time the operator turns the key. For example, noise or multiple pulses on the input of an SSR can cause higher switching losses, which is one reason to avoid simply replacing a mechanical relay with an SSR. A debounce unit, such as a time delay, in a relay device that uses an SSR may have advantages over an SSR with no debounce unit, especially in applications where there may be some noise on the input.

FIG. 1 is a conceptual and schematic block diagram illustrating an example system 50 comprising an SSR 10, a power source 100, an input switch 104 and a load 102. The power source is depicted as a battery 100 in this example. SSR 10 may include an output port 108 and an input port 112 as well as a power switch 16. The output (pin 1) of power switch 16 corresponds to the output port 108. SSR 10 may include a control unit 13 configured to receive an input signal at the input port of SSR 10. Control unit 13 may comprise a voltage verification unit 12 and a time delay unit 14. Voltage verification unit 12 may determine if the voltage level $V_{in}$ (34) of the input signal received at the input port 112 satisfies a voltage threshold. In response to the voltage level 34 of the input signal satisfying a threshold the voltage verification unit 12 may send trigger signal to the trigger input 15 of a time delay unit 14 to start a pre-determined time delay. Time delay unit 14 may wait for a pre-determined time delay, and after the pre-determined time delay, activate power switch 16. Activating power switch 16 controls the output 108 of SSR 10. Controlling the output 108 of SSR 10 may deliver power to the load 102, or turn off power to the load 102. A designer may select a value for C_delay 24 to configure the pre-determined time delay. The delay capacitor, C_delay (24) may be external to control unit 13, or may be an internal component that is part of control unit 13. The description of FIG. 3 will discuss the function of C_delay 24 in more detail.

Input switch 104 is configured to supply the input signal, with a voltage level $V_{in}$ (34), to an input port 112 of SSR 10. Input switch may comprise a mechanical switch, a hall switch, a control unit switch and an electronic control unit or another type of switch. An example of a switch that can control a relay may be an internal transistor of an engine control unit (ECU) such as those found on internal combustion engines. The internal switches in an ECU may be used to control a relay that further controls some other component of the engine. The load 102 may comprise one or more of a motor, a solenoid, a relay, an actuator, a lighting fixture, a valve or other similar loads. An example may be the motor for a heating, ventilation, and air conditioning (HVAC) system. Another example may be a bank of high intensity lighting such as that used for lighting sports stadiums.

If the input switch 104 is a mechanical input switch, as shown in FIG. 1, it may be subject to corrosion or contamination. Mechanical switches operating in high humidity, in the presence of hydrocarbons can develop corrosion or contamination on the mechanical contacts. One example may be a mechanical switch on the retractable landing gear of an aircraft that may be used to indicate the position of the landing gear. Such a switch operates in a harsh environment subject to dirt, moisture, hydraulic fluid and the like. In one example the air gap that separates the electrical contacts provides high electrical resistance when the switch is open. Corrosion or contamination may reduce the resistance and create a current leakage path. Corrosion or contamination may result in an open circuit, a short, or other mechanical failure. FIG. 1 depicts the effect of corrosion or contamination as R_dirt 106. R_dirt 106 should be near infinite, or in the high mega ohm range for the switch to operate correctly. As R_dirt 106 decreases, this may cause an increase in current leakage. R_dirt 106 may eventually get low enough to inadvertently activate SSR 10. A system designer may configure R_selected 22 to work with a voltage threshold set within the voltage verification unit 12 to detect whether R_dirt 106 is low enough to create a leakage fault, but above a defined resistance level. The description of FIG. 2 will discuss R_selected 22 further.

Control unit 13 may control power switch 16 by controlling a switch 20 on the input side of power switch 16, through pins 2 and 4. Control unit 13 may also control power switch 16 by directly driving pin 2. Switch 20 may be an insulated gate bipolar transistor (IGBT) device. Alternatively, switch 20 can be any controllable switch such as metal oxide semiconductor field-effect transistor (MOSFET) devices, integrated gate commutated thyristor (IGCT) devices, gate turn-off thyristor (GTO) devices, silicon controlled rectifier (SCR) devices, junction gate field-effect transistor (JFET) devices, MOS controlled thyristor (MCT) devices, bipolar junction transistor (BJT), opto-isolator and similar switches.

Figure 2:
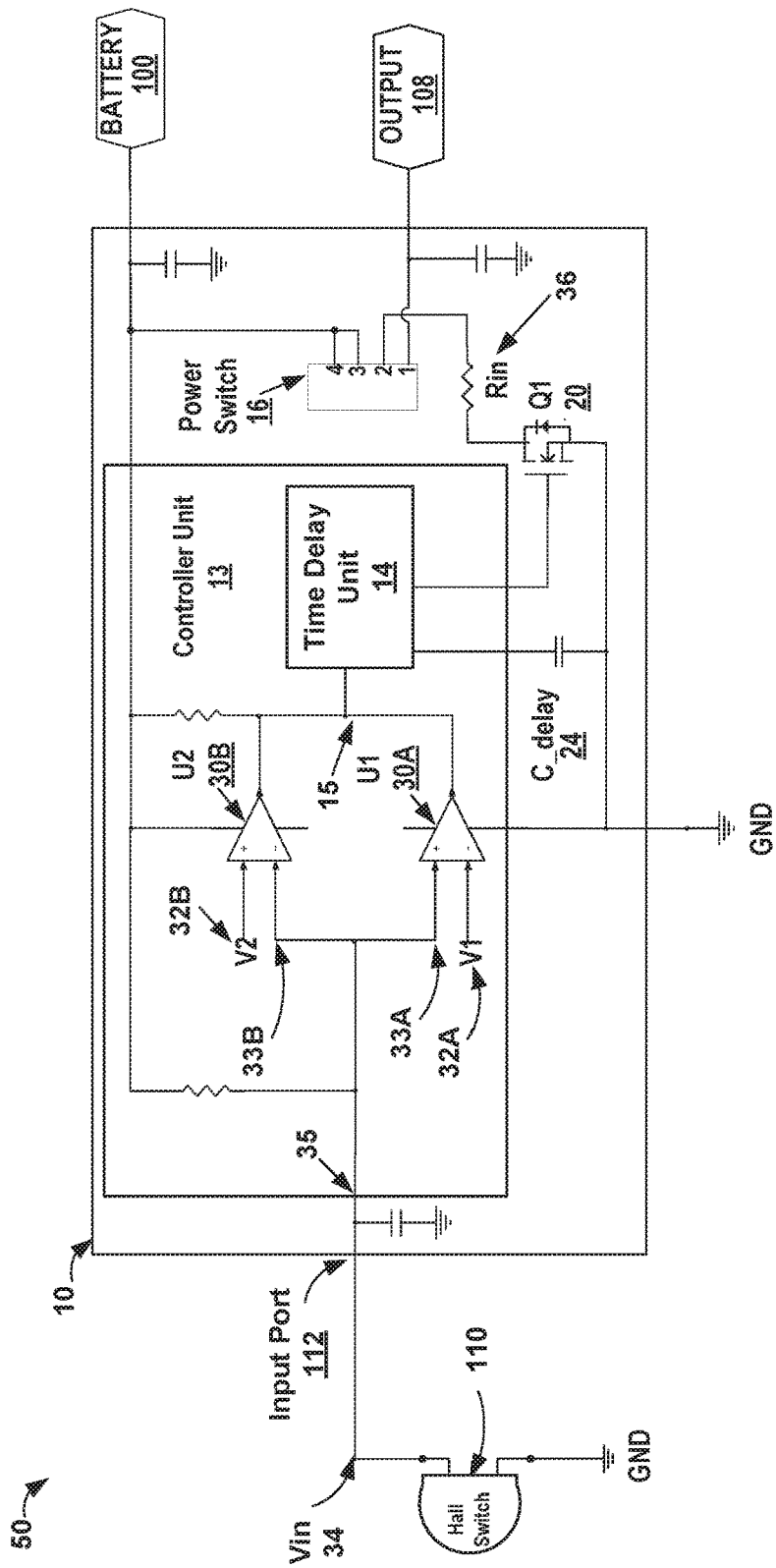
FIG. 2 is a conceptual and schematic block diagram illustrating the SSR of FIG. 1, with a more detailed depiction of an example circuit to verify that the input signal meets a voltage level threshold.

FIG. 2 is a conceptual and schematic block diagram illustrating an example of system 50 and SSR 10 containing more detail describing an example of a circuit that may verify that a voltage meets a threshold, in accordance with the techniques of this disclosure. An example is to use a window comparator circuit comprising two comparators U1 (30A) and U2 (30B) arranged with a lower and upper voltage thresholds, V1 (32A) and V2 (32B) respectively. A first input 33A of a first comparator U1 (30A) and a first input 33B of a second comparator U2 (30B) may be coupled to the input 35 of control unit 13 and thereby to the input port 112 of SSR 10. The second input of the first comparator U1 (30A) may be coupled to the first voltage threshold V1 (32A), which as shown in this example is the lower voltage threshold. The second input of the second comparator U2 (30B) may be coupled to the second voltage threshold V2 (32B), which as shown in this example is the upper voltage threshold. Independent hysteresis may be set to comparators U1 (30A) and U2 (30B) to avoid toggling output (15) when $V_{in}$ 34 is close to voltage thresholds, V1 (32A) or V2 (32B).

The example window comparator circuit shown in FIG. 2 is arranged as an open collector comparator. In this circuit, both comparators must be OFF at the same time to output a HIGH. A comparator that is ON has its output connected to ground and is therefore LOW. In this example, HIGH indicates a logical HIGH level, also called a logical one (1). A LOW indicates a logical LOW level also called a logical zero (0). For U1 (30A) the input signal $V_{in}$ (34) is coupled to the PLUS input of U1, and the lower threshold, V1 (32A) is coupled to the MINUS input. If the voltage level $V_{in}$ (34) of the input signal is less the lower threshold, V1 (32A), this will set the MINUS input of U1 (30A) to be greater than the PLUS input. When the MINUS input of a comparator is greater than the PLUS input, this turns the comparator on, which connects the output of U1 to ground and thus the output is LOW.

Similar, but opposite for U2 (30B) where the input signal $V_{in}$ (34) is coupled to the MINUS input of U2, and the upper threshold, V2 (32B) is coupled to the PLUS input. If Vin is above the upper voltage threshold V2, the MINUS input on U2 is greater than the PLUS input, which connects the output of U2 to ground and the output goes LOW. Only when the voltage level $V_{in}$ (34) of the input signal is both greater than lower threshold, V1 (32A), and less than the upper voltage threshold V2 (32B) will both outputs be HIGH. The control unit 13 determines that the voltage level $V_{in}$ (34) of the input signal is "inside the window" or "satisfies a threshold" when $V_{in}$ is both greater than the lower voltage threshold and less than the upper voltage threshold.

In the example of FIG. 2, the combined outputs of U2 (30B) and U1 (30A) are coupled to the trigger input 15 of time delay unit 14. When both the output of U2 (30B) and the output of U1 (30A) are HIGH (i.e. the voltage level $V_{in}$ (34) of the input signal satisfies a threshold), this outputs the trigger signal for the time delay unit 14 to begin the pre-determined time delay, and after the pre-determined time delay, control SSR 10.

In FIG. 2, the voltage thresholds V1 and V2 of control unit 13 may be configured to detect one or more faults. A first fault may be where the input signal is shorted to ground (STG). This may happen, for example, if the insulation fails in line between the input switch 110 and the input port 112 to SSR 10 and touches ground. Ground can comprise equipment ground, earth ground or the like. In this example, the voltage level $V_{in}$ (34) of the input signal will be at near zero volts. The lower voltage threshold V1 (32A) may be configured high enough such that a voltage level $V_{in}$ (34) at or near zero volts would not satisfy the voltage threshold criteria.

Upper voltage threshold V2 of control unit 13 may be configured to detect a second type of fault, specifically a short to battery (STB). Note that while this disclosure uses the terms battery 100 and STB for convenience, this second type of fault can be a short to any kind of power supply, as described above. Similar to the STG, a short to battery can occur if, for example, the insulation fails in the line between battery 100 and the input port 112. With an STB, the input signal voltage level $V_{in}$ (34) may be held at or near the battery voltage. To detect a STB fault, a designer can select the upper voltage threshold V2 (32B) such that that a voltage level $V_{in}$ (34) at or near battery 100 voltage be too high satisfy the voltage threshold criteria. As described above, if the input signal voltage level $V_{in}$ (34) is greater than the upper voltage threshold V2 (32B), the output of U2 goes LOW. This will prevent a trigger signal from being sent to the trigger input 15 of time delay unit 14 and thereby prevent SSR 10 activation when the input voltage signal does not meet the threshold criteria.

The upper voltage threshold V2 (32B) may also be configured to detect a third type of fault caused by leakage in the input signal. This may occur, for example, if R_dirt 106 gets too low but above a defined level, as discussed above. In this example, a designer may configure R_selected 22 and V2 (32B) to detect this third type of fault by selecting the values of R_selected 22 and V2 (32B) such that if the leakage in the input signal is more than specified, $V_{in}$ (34) will increase above the upper threshold V2. Therefore, the lower threshold V2 (32B) may be configured to detect both the second type of fault, an STB, and the third type of fault, leakage in the input signal. In other words, V2 (32B) is used to detect STB and R_DIRT above defined value.

Figure 3:
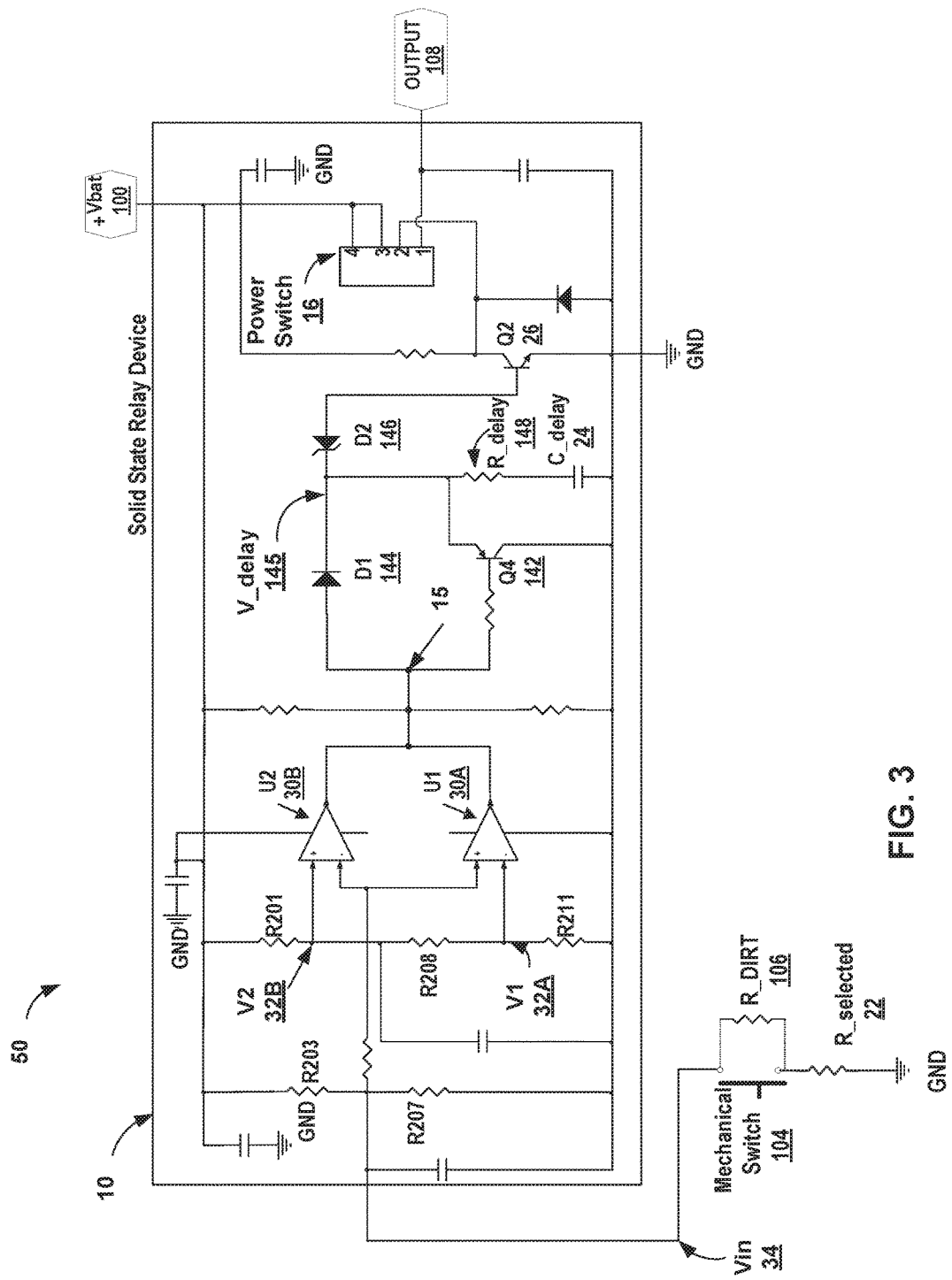
FIG. 3 is a conceptual and schematic block diagram illustrating the SSR of FIG. 1, with a more detailed view of example circuits that verify the input signal voltage level and implement a timing delay.

FIG. 3 is a conceptual and schematic diagram of system 50 that depicts an example circuit that may be used to implement the time delay unit 14, in accordance with the techniques of this disclosure. In the example of FIG. 3, the trigger input 15 is coupled to both the output of the first comparator U1 (30A) and the output of the second comparator U2 (30B). In response to the input signal voltage level $V_{in}$ (34) satisfying a threshold, as described above, both the output of comparator U1 (30A) and the output of comparator U2 (30B) will output a logical HIGH. This logical HIGH is the trigger signal that starts a pre-determined time delay. In this example, trigger input 15 set to a logical HIGH, which will start charging C_delay 24 through D1 144 and R_delay 148. Once V_delay 145 exceeds the zener breakdown voltage of D2 146, this will energize the base of transistor Q2 26. In this example, Q2 26 conducts current through pins 2 and 4, of power switch 16, which supplies power to the output port 108 through pins 1 and 3 of power switch 16. A designer may configure the predetermined time delay by selecting values for R_delay 148 and C_delay 24. These values configure how long it will take C_delay 24 to charge and therefore how long it will take V_delay 145 to reach the zener breakdown voltage of D2 146. Removing C_delay 24 from the circuit may set the time delay to zero, in this example. Transistor Q4 (142) allows C_delay 24 to rapidly discharge when the trigger signal at the trigger input 15 goes LOW. The function of transistor Q4 (142) will be explained in more detail in the description of FIG. 4.

Note that the circuit described above is just one possible example of a circuit to implement the time delay unit 14. Other components and circuit arrangements can implement a similar time delay unit 14. For example, Q2 (26) could be implemented with a MOSFET and Q4 (142) could be implemented with an arrangement of diodes or other semiconductors. Another example could be an arrangement of individual components, whether through-wire or surface mount. Yet another example could be an arrangement fully or partially using an integrated circuit (IC). Implementing a time delay unit 14 as part of control unit 13 gives SSR 10 the ability to manage an unstable input signal. For example, if the input switch is a mechanical switch 104 as shown in FIGS. 1 and 3, the input signal may be subject to "bouncing," as described above. The predetermined time delay of time delay unit 14 may be configured to "debounce" the signal. That is, wait for a predetermined time until the mechanical contacts settle. The debounce time can vary from switch to switch, even though the switches are the same type from the same manufacturer. The debounce time can vary for the same switch between a first, second or third time the switch is pressed. For some switches, this debounce time may need to be approximately 5 milliseconds or less. For other switches the debounce time may need to be 30 milliseconds or more. A designer may select a predetermined time delay that works best to debounce voltage level $V_{in}$ (34) of the input signal from the input switch 104 used in system 50.

FIGS. 1, 2 and 3 illustrate some other working principles of this system and device in accordance with the techniques of this disclosure. FIG. 2 depicts another example input switch 110 that may be arranged to supply the input signal to the SSR 10. In this example, the input switch may be a Hall (magnetic) switch 110. In one example, for a Hall switch or for a semiconductor switch driven by an ECU, corrosion or contamination is less of a concern than for a mechanical switch, like that depicted in FIG. 1. This means the second type of fault from leakage on the input signal from R_dirt 106 may be of less concern when using a Hall type of input switch. In the example of FIG. 2 depicting the Hall input switch 110, the system may not require R_selected 22. The Hall switch "on-voltage", which may be specific to each manufacturer or component, may be used to set the first voltage threshold V1 (32A) to detect the STG fault. The input switch 104 and 110, as illustrated in the examples of FIGS. 1 to 3, is shown in an active low configuration. Note that by tuning the values of the resistor network depicted in FIGS. 1 through 3 a designer can change the input switch 104/110 from an active low configuration to an active high configuration. As an example, an active high configuration may have input switch 104 and R_selected 22 connected between Vin and Vbat, rather than to GND as shown in FIG. 1. Changing from active high to active low configuration may also require adjusting the thresholds for V1 and V2.

Some example equations may include the following:
Where: R1 in parallel with R2 is depicted by R1//R2

Total Switch resistance: $R\_switch = R\_dirt + R\_selected$   Eq. 1:

SSR10 input voltage: $V_{in} = Vbat*((R207//R\_switch)/[(R207//R\_switch)+R203])$   Eq. 2:

Without DIRT resistance: $V_{in\_noDIRT} = Vbat*\{(R207/R\_selected)/[(R207//R\_selected)+R203]\}$   Eq. 3:

With DIRT resistance: $V_{in\_DIRT} = Vbat*\{(R207//(R\_dirt+R\_selected))/[(R207//(R\_dirt+R\_selected))+R203]\}$   Eq. 4:

First threshold voltage: $V1 = R211*Vbat/(R201+R208+R211)$   Eq. 5:

Second threshold voltage: $V2 = (R208+R211)*Vbat/(R201+R208+R211)$   Eq. 6:

The function of system 50 may also be illustrated by the table below.

| Input switch signal state | $V_{in}$ (34) | $V_{in}$ Status | Trigger Signal (15) | SSR output after debounce time |
|---|---|---|---|---|
| Wire Short to battery (STB) | $V_{in}$ = Vbat | $V_{in} > V2$ (32B) | LOW | LOW |
| Normal condition switch OFF & R_DIRT resistance above defined value | $V_{in}$ | $V_{in} > V2$ (32B) | LOW | LOW |
| Normal condition switch ON: no DIRT resistance | $V_{in\_noDIRT}$ | V2 (32B) > $V_{in}$ > V1 (32A) | HIGH | HIGH |
| Normal condition switch OFF: with DIRT resistance below defined value | $V_{in\_DIRT}$ | V2 > $V_{in}$ > V1 | HIGH | HIGH |
| Wire short to Ground | $V_{in}$ = 0 | $V_{in}$ < V1 | LOW | LOW |

Figure 4:
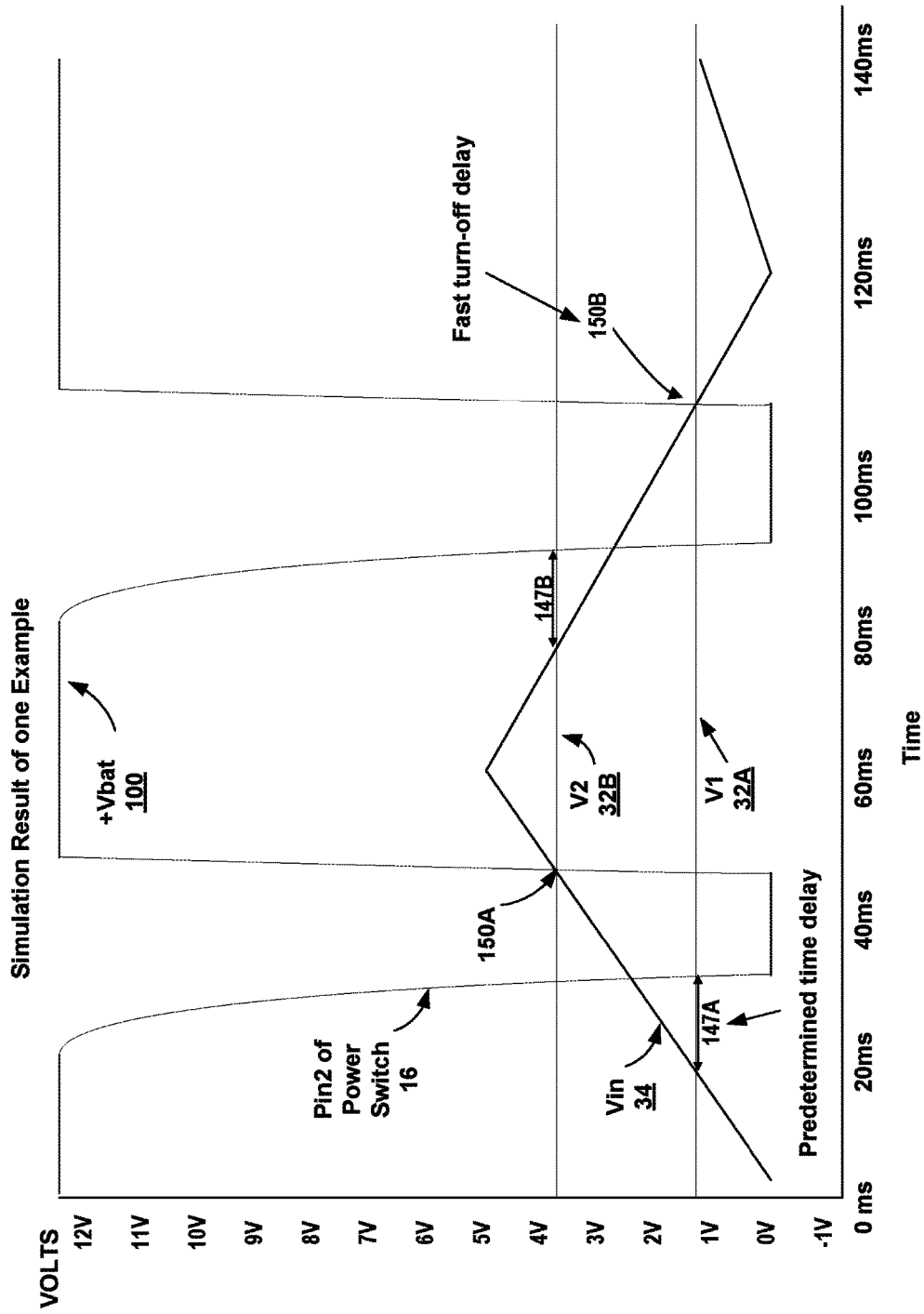
FIG. 4 is a diagram illustrating an example of signal levels and signal level timing during the operation of the SSR of FIG. 2.

FIG. 4 is a diagram illustrating an example of signal levels and signal level timing during the operation of the SSR 10 of FIG. 1, in accordance with the techniques of this disclosure. In this example when pin 2 of power switch 16 is at 12 Volts (+Vbat 100), no power flows to the load 102 (see FIG. 1). When pin 2 is at zero volts, indicates the SSR 10 is activated and delivering power to load 102. FIG. 4 shows $V_{in}$ (34) as a triangle wave over time. Depicting $V_{in}$ (34) as a triangle wave over time in this example is a one way to illustrate the function of SSR 10. In the motorcycle example discussed above, $V_{in}$ (34) may appear more as a square wave, with some instability as the mechanical input switch 104 bounces (not shown).

Beginning at time 0 ms, $V_{in}$ (34) begins at 0 V. At approximately 17 ms, $V_{in}$ (34) exceeds the first voltage threshold V1 (32A), configured to be IV in this example, indicating $V_{in}$ (34) satisfies the threshold. In response to $V_{in}$ (34) satisfying the threshold, control unit 13 may output a trigger signal from the first and second comparator (a logical HIGH as discussed above) and wait for a predetermined time delay 147A. As long as $V_{in}$ (34) satisfies the threshold, time delay 147A continues. After waiting for the predetermined time delay, control unit 13 may control the output of power switch 16, thereby controlling output 108 of SSR 10. In this example, at approximately time 30 ms, control unit 13 activates the output of power switch 16, which brings output 108 to zero volts and delivers power to load 102.

At approximately time 45 ms, $V_{in}$ (34) increases enough to exceed the second voltage threshold V2 (32B), in this example set to about 3.6 V. In response to the input voltage $V_{in}$ (34) of the input signal no longer satisfying a threshold, control unit 13 may control power switch 16 to cause output 108 to turn off and no longer supply power to load 102. This is shown in the example of FIG. 4 as pin 2 of power switch 16 rising to +Vbat 100 with a fast turn-off delay 150A. $V_{in}$ (34) peaks at about 60 ms, in this example and at approximately 80 ms is less than the second voltage threshold V2 (32B). Therefore, this example shows that at 80 ms $V_{in}$ (34) satisfies the threshold criteria and in response, control unit 13 again waits for a predetermined time delay 147B. After the pre-determined time delay 147B, at about 90 ms in this example, control unit 13 may control pin 2 of power switch 16 to cause output 108 to deliver power to load 102. At approximately 110 ms $V_{in}$ (34) is less than V1 (32A) and $V_{in}$ (34) no longer satisfies the threshold criteria. Control unit 13 may control power switch 16 to cause output 108 to turn off shown in the example of FIG. 4 as pin 2 of power switch 16 rising to +Vbat 100 with a fast turn-off delay 150B. FIG. 4 illustrates only one possible example of how SSR 10 and system 50 may function.

Figure 5:
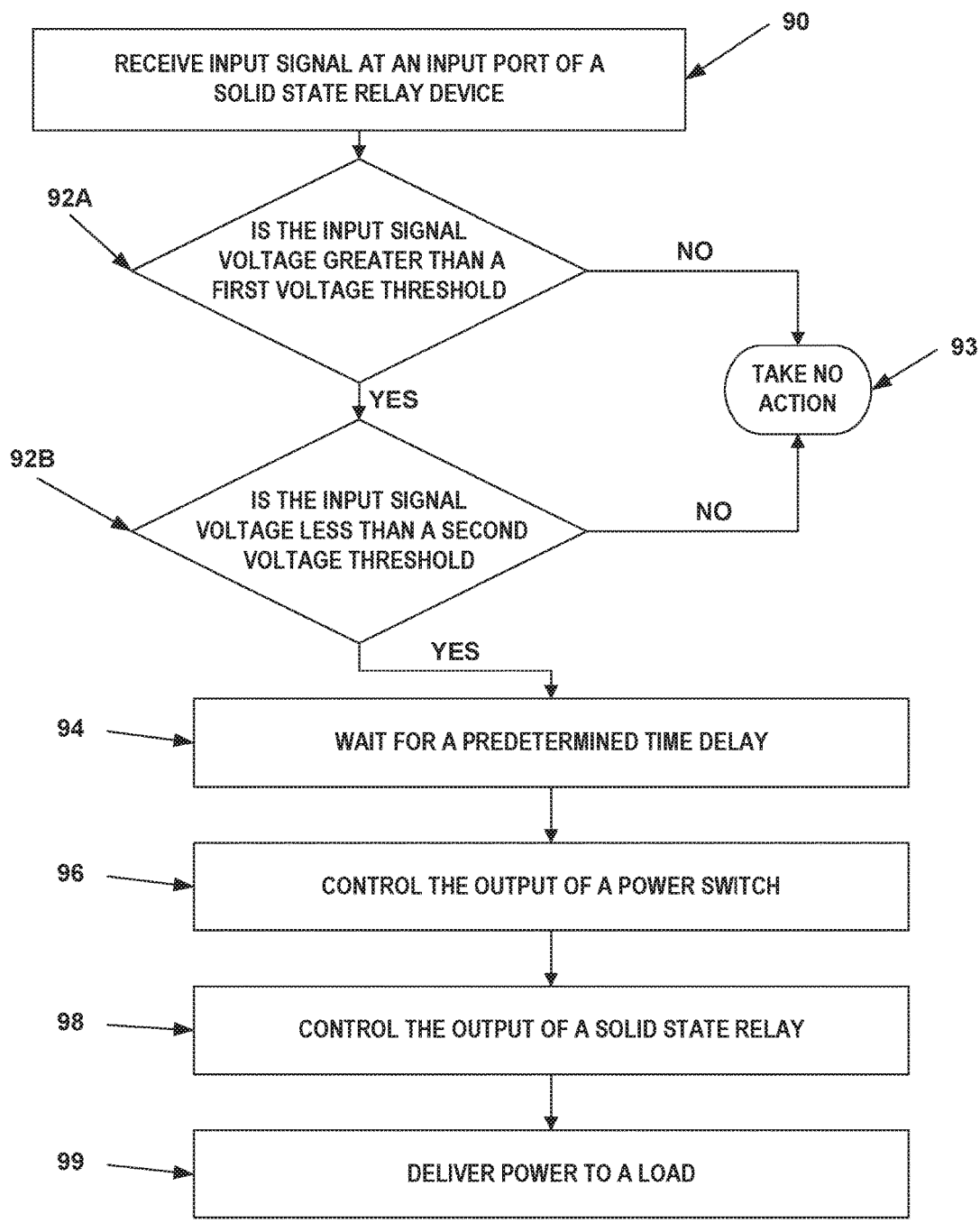
FIG. 5 is a flow chart illustrating an example technique to operate a solid state relay device.

FIG. 5 is a flow chart illustrating an example mode of operation of a system 50 comprising SSR 10, an input switch 104 and a load 102, in accordance with the techniques of this disclosure. The explanation below considers system 50 and SSR 10 from FIGS. 1, 2 and 3 as well as the signal levels and timing from FIG. 4.

SSR 10 may receive an input signal an input port (90). This input signal may be delivered to the input port of SSR 10 by activating an input switch 104. The input switch may be activated by manually, such as the starter switch on an automobile or by a switch for controlling a bank of lights. The switch may also be activated by a control system, such as a thermostat controlling an HVAC system, an engine control unit (ECU) controlling a component of an engine, or a body control module (BCM) that may control power windows, solenoids that control power locks and the like.

Once SSR 10 receives the input signal, control unit 13 may determine if the input signal voltage $V_{in}$ 34 is greater than a first voltage threshold V1 32A (92A). If $V_{in}$ (34) is less than the first voltage threshold V1, then the voltage level of the input signal may not satisfy a threshold and control unit 13 may take no action (93). If $V_{in}$ (34) is greater than the first voltage threshold, control unit 13 may determine if $V_{in}$ (34) is also less than a second voltage threshold V2 32B (92B). Similar to 92A, if $V_{in}$ (34) is greater than the second voltage threshold V2, then the voltage level of the input signal may not satisfy a threshold and control unit 13 may take no action (93). In response to control unit 13 determining that the input signal voltage $V_{in}$ 34 is both is greater than the first voltage threshold V1 (32A) and less than a second voltage threshold V2 (32B), control unit 13 may wait for a predetermined time delay (94). After the pre-determined time delay, control unit 13 may control the output of the power switch 16 (96), thereby controlling the output 108 of SSR 10 (98). Controlling the output 108 of SSR 10 may deliver power to a load 102 (99). Also note that in the case when $V_{in}$, 34 was between V1 and V2, but then moves outside the V1-V2 band the predetermined time delay of step 94 will restart by rapidly discharging C_delay 24 through Q4 (142). This was discussed in more detail above in FIG. 3 and FIG. 4.

The following examples may illustrate one or more aspects of the disclosure.

Example 1

A solid state relay (SSR) device that includes an output port and an input port, the relay device comprising: a power switch wherein an output of the power switch corresponds to the output port of the SSR device; and a control unit configured to: receive an input signal at the input port of the SSR device; determine a voltage level of the input signal received at the input port: and in response to the voltage level of the input signal satisfying a threshold, wait for a predetermined time delay, and after the predetermined time delay, control the output of the power switch, thereby controlling the output of the SSR device.

Example 2

The device of example 1, wherein the control unit determines the voltage level of the input signal satisfies a threshold by determining that the voltage level is both greater than a first threshold voltage, and less than a second threshold voltage.

Example 3

The device of any of examples 1-2 wherein the control unit is configured to detect a first fault and a second fault in the input signal, based the value of the first voltage threshold, wherein the first fault comprises a short to ground (STG) and the second fault comprises a leakage in the input signal.

Example 4

The device of any of examples 1-3 wherein the control unit is configured to detect a third fault in the input signal based on the value of the second voltage, wherein the third fault comprises a short to battery (STB).

Example 5

The device of any of examples 1-4 wherein the control unit comprises: a first comparator; a second comparator; and a time delay unit that includes a trigger input; and wherein the trigger input is coupled to both an output of the first comparator and an output of the second comparator; and wherein the time delay unit, in response to a trigger signal at the trigger input, is configured to wait for a pre-determined time delay, and after the pre-determined time delay, control the output of the SSR; and wherein a first input of the first comparator is coupled to the input port of the relay device and a second input of the first comparator is coupled to the first voltage threshold; and wherein a first input of the second comparator is coupled to the input port of the relay device a second input of the second comparator coupled to the second voltage threshold; and wherein the output of the first comparator, in response to the voltage level of the input signal being greater than the first voltage threshold, outputs the trigger signal to the trigger input; and wherein the output of the second comparator, in response to the voltage level of the input signal being less than the second voltage threshold, outputs the trigger signal to the trigger input.

Example 6

The device of any of examples 1-5, wherein the predetermined time delay is a configurable parameter.

Example 7

The device of any of examples 1-6, configured with an independent hysteresis for the first voltage threshold and the second voltage threshold.

Example 8

The device of any of examples 1-7 wherein the predetermined time delay is between approximately 5 milliseconds and approximately 30 milliseconds.

Example 9

The device of any of examples 1-8 wherein the time delay unit controls the SSR by activating a switch comprising one or more of: a bipolar junction transistor (BJT), an insulated gate bipolar transistor (IGBT), a metal-oxide semiconductor field effect transistor (MOSFET), and an opto-isolator.

Example 10

A method comprising: receiving an input signal at an input port of a solid state relay (SSR) device; determining whether a voltage level of the input signal received at the input port of the SSR device satisfies a threshold; and in response to the voltage level of the input signal satisfying the threshold, controlling an output of the SSR device after a predetermined time delay.

Example 11

The method of example 10, wherein determining whether the voltage level of the input signal received at the input port of the SSR device satisfies a threshold comprises determining that the input signal voltage level is greater than a first voltage threshold and less than a second voltage threshold.

Example 12

The method of claim 11 further comprising: in response to determining whether a voltage level of the input signal received at the input port of the SSR device satisfies the threshold, outputting a trigger signal such that the trigger signal has a first logic level if the voltage level of the input signal received at the input port of the SSR device satisfies the threshold and such that the trigger signal has a second logic level otherwise; wherein the input port of the SSR device is coupled both to a first input of a first comparator and to a first input of a second comparator; and wherein a second input of the first comparator is coupled to the first voltage threshold and a second input of the second comparator is coupled to the second voltage threshold; and wherein outputting the trigger signal comprises: outputting the first logic level by an output of the first comparator if the voltage level of the input signal received at the input port of the SSR is greater than the first voltage level and outputting a second logic level by the output of the first comparator otherwise; and outputting the first logic level by an output of the second comparator if the voltage level of the input signal is less than the second voltage level and outputting a second logic level by the output of the second comparator otherwise; and in response to the trigger signal having the first logic level, thereby indicating the voltage level of the input signal satisfies the threshold, controlling an output of the SSR after a predetermined time delay.

Example 13

The method of any of examples 10-12 wherein the voltage level of the input signal received at the input port of the SSR satisfying a threshold indicates that the SSR determined the input signal was free of a fault comprising one or more of: a short to battery (STB), a short to ground (STG) and leakage in the input signal.

Example 14

The method of any of examples 10-13, wherein the predetermined time delay comprises a delay between approximately 5 milliseconds and approximately 30 milliseconds Example 15

The method of any of examples 10-14, wherein the predetermined time delay comprises delaying for sufficient time to debounce the input signal.

Example 16

A system comprising: a solid state relay (SSR) device that includes an output port and an input port, the relay device comprising: a power switch wherein an output of the power switch corresponds to the output of the SSR device; and a control unit configured to: receive an input signal at the input port of the SSR device; determine a voltage level of the input signal received at the input port; and in response to the voltage level of the input signal satisfying a threshold, wait for a predetermined time delay, and after the predetermined time delay, control the output of the power switch, thereby controlling the output of the SSR relay device; an input switch configured to supply the input signal to the input port of the SSR device; and a load controlled by the output port of the SSR device.

Example 17

The system of example 16, wherein the input switch is selected from a group consisting of a mechanical switch, a hall switch, a control unit switch and an electronic control unit.

Example 18

The system of any of examples 16-17 wherein the load comprises one or more of: a motor, a solenoid, an actuator, a lighting fixture, and a valve Example 19

The system of any of examples 16-18 wherein the threshold is configured to detect a fault, wherein the fault comprises a short to battery (STB), a short to ground (STG) and leakage in the input signal.

Example 20

The system of any of examples 16-19 wherein the solid state relay device can be configured to receive either an active high or active low signal from the input switch.

Various embodiments of the invention have been described. These and other embodiments are within the scope of the following claims.

The invention claimed is:
1. A solid state relay (SSR) device comprising:
an output port;
an input port,
a power switch having an output that corresponds to the output port; and
a control unit comprising a voltage verification unit, wherein the voltage verification unit is directly connected to the input port, wherein the control unit is configured to:
receive an input signal at the input port;
with the voltage verification unit, determine whether a voltage level of the input signal received at the input port satisfies a threshold; and
in response to the voltage level of the input signal satisfying the threshold, wait for a predetermined time delay, and after the predetermined time delay, control the output of the power switch, thereby controlling the output port.

2. The SSR device of claim 1, wherein the control unit determines the voltage level of the input signal satisfies the threshold by determining that the voltage level is both:
   greater than a first voltage threshold, and
   less than a second voltage threshold.

3. The SSR device of claim 2, wherein the control unit is configured to detect a first fault in the input signal based on the value of the first voltage threshold, wherein the first fault comprises a short to ground (STG).

4. The SSR device of claim 2, wherein the control unit is configured to detect a second fault and a third fault in the input signal, based on the value of the second voltage threshold, wherein the second fault comprises a short to battery (STB) and the third fault comprises a leakage in the input signal.

5. The SSR device of claim 2, wherein:
   the voltage verification unit comprises:
      a first comparator;
      a second comparator; and
   the control unit further comprises:
      a time delay unit that includes a trigger input,
      wherein the trigger input is coupled to both an output of the first comparator and an output of the second comparator,
      wherein the time delay unit, in response to a trigger signal at the trigger input, is configured to wait for the predetermined time delay, and after the predetermined time delay, control the output of the power switch,
      wherein a first input of the first comparator is coupled to the input port and a second input of the first comparator is coupled to the first voltage threshold,
      wherein a first input of the second comparator is coupled to the input port and a second input of the second comparator is coupled to the second voltage threshold,
      wherein the output of the first comparator, in response to the voltage level of the input signal being greater than the first voltage threshold, outputs the trigger signal to the trigger input, and
      wherein the output of the second comparator, in response to the voltage level of the input signal being less than the second voltage threshold, outputs the trigger signal to the trigger input.

6. The SSR device of claim 1, wherein the predetermined time delay is a configurable parameter.

7. The SSR device of claim 2, configured with an independent hysteresis for the first voltage threshold and the second voltage threshold.

8. The SSR device of claim 7, wherein the predetermined time delay is between approximately 5 milliseconds and approximately 30 milliseconds.

9. The SSR device of claim 5, wherein the time delay unit controls the power switch by activating a switch comprising one or more of: a bipolar junction transistor (BJT), an insulated gate bipolar transistor (IGBT), a metal-oxide semiconductor field effect transistor (MOSFET), and an opto-isolator.

10. A method comprising:
    receiving, by a control unit of a solid state relay (SSR) device, an input signal at an input port of the solid state relay (SSR) device, wherein the control unit comprises a voltage verification unit that is directly connected to the input port;
    determining, by the voltage verification unit, whether a voltage level of the input signal received at the input port of the SSR device satisfies a threshold; and
    in response to the voltage level of the input signal satisfying the threshold, controlling an output port of the SSR device after a predetermined time delay.

11. The method of claim 10, wherein determining whether the voltage level of the input signal received at the input port of the SSR device satisfies a threshold comprises determining that the input signal voltage level is greater than a first voltage threshold and less than a second voltage threshold.

12. The method of claim 11, further comprising:
    in response to determining whether the voltage level of the input signal received at the input port of the SSR device satisfies the threshold, outputting a trigger signal comprising a first logic level or a second logic level, wherein the trigger signal has the first logic level when the voltage level of the input signal satisfies the threshold; and, when the voltage level of the input signal does not satisfy the threshold, the trigger signal has the second logic level,
    wherein the input port of the SSR device is coupled both to a first input of a first comparator and to a first input of a second comparator,
    wherein a second input of the first comparator is coupled to the first voltage threshold and a second input of the second comparator is coupled to the second voltage threshold,
    wherein outputting the trigger signal comprises:
       outputting the first logic level by an output of the first comparator if the voltage level of the input signal received at the input port of the SSR device is greater than the first voltage level and outputting the second logic level by the output of the first comparator otherwise; and
       outputting the first logic level by an output of the second comparator if the voltage level of the input signal is less than the second voltage level and outputting the second logic level by the output of the second comparator otherwise; and
    in response to the trigger signal having the first logic level, thereby indicating the voltage level of the input signal satisfies the threshold, controlling an output of the SSR device after a predetermined time delay.

13. The method of claim 11, wherein the voltage level of the input signal received at the input port of the SSR device satisfying the threshold indicates the SSR device determining the input signal was free of a fault comprising one or more of: a short to battery (STB), a short to ground (STG) and a leakage in the input signal.

14. The method of claim 10, wherein the predetermined time delay comprises a delay between approximately 5 milliseconds and approximately 30 milliseconds.

15. The method of claim 10, further comprising waiting for the predetermined time delay to debounce the input signal.

16. A system comprising:
    a solid state relay (SSR) device, the SSR device comprising:
       an output port;
       an input port;
       a power switch having an output that corresponds to the output port; and
       a control unit comprising a voltage verification unit, wherein the voltage verification unit is directly connected to the input port, wherein the control unit is configured to:

receive an input signal at the input port;
with the voltage verification unit, determine whether a voltage level of the input signal received at the input port satisfies a threshold; and
in response to the voltage level of the input signal satisfying the threshold, wait for a predetermined time delay, and after the predetermined time delay, control the output of the power switch, thereby controlling the output port;
wherein the system further comprises:
an input switch configured to supply the input signal to the input port of the SSR device; and
a load controlled by the output port of the SSR device.

17. The system of claim 16, wherein the input switch is selected from a group consisting of a mechanical switch, a hall switch, a control unit switch and an electronic control unit.

18. The system of claim 16, wherein the load comprises one or more of: a motor, a solenoid, an actuator, a lighting fixture, and a valve.

19. The system of claim 16, wherein the threshold is configured to detect a fault, wherein the fault comprises one or more of: a short to battery (STB), a short to ground (STG) and a leakage in the input signal.

20. The system of claim 16, wherein the SSR device is configured to receive either an active high or active low signal from the input switch.

* * * * *